(12) United States Patent
Wang

(10) Patent No.: US 11,862,051 B2
(45) Date of Patent: Jan. 2, 2024

(54) DISPLAY PANEL AND LIGHT BOARD

(71) Applicant: TCL CHINA STAR OPTOELECTRONICS TECHNOLOGY CO., LTD., Shenzhen (CN)

(72) Inventor: Juan Wang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/771,488

(22) PCT Filed: Mar. 15, 2022

(86) PCT No.: PCT/CN2022/080853
§ 371 (c)(1),
(2) Date: Apr. 24, 2022

(87) PCT Pub. No.: WO2023/164976
PCT Pub. Date: Sep. 7, 2023

(65) Prior Publication Data
US 2023/0282138 A1 Sep. 7, 2023

(30) Foreign Application Priority Data
Mar. 2, 2022 (CN) .......................... 202210197653.8

(51) Int. Cl.
*G09F 9/33* (2006.01)
*H01L 27/15* (2006.01)
(Continued)

(52) U.S. Cl.
CPC ................. *G09F 9/33* (2013.01); *G09G 3/32* (2013.01); *H01L 25/0753* (2013.01); *H01L 27/156* (2013.01); *H01L 2933/0066* (2013.01)

(58) Field of Classification Search
CPC ......... G09F 9/33; G09G 3/32; H01L 25/0753; H01L 27/156; H01L 2933/0066
See application file for complete search history.

(56) References Cited

U.S. PATENT DOCUMENTS 8,801,357 B2 * 8/2014 Bonn .................... B65G 57/302
  414/785
10,613,389 B2 * 4/2020 Liu ....................... H05K 1/0204
(Continued)

FOREIGN PATENT DOCUMENTS

| CN | 110322787 A | 10/2019 |
|----|-------------|---------|
| CN | 110634400 A | 12/2019 |

(Continued)

*Primary Examiner* — Vinh T Lam
(74) *Attorney, Agent, or Firm* — The Roy Gross Law Firm, LLC; Roy Gross

(57) ABSTRACT

A display panel and a light board are provided. The display panel includes a back board and a plurality of light boards, each of the plurality of light boards includes light beads and a first substrate and a second substrate that are disposed in a stack. The first substrate includes a first portion and the second substrate includes a second portion that exceeds the first substrate. The first portion of one of the plurality of light boards is stacked with the second portion of an adjacent light board to splice two of the plurality of light boards, and a distance between two columns of the plurality of light beads adjacent to each other and on an outermost side of the two light boards is within a preset range.

18 Claims, 3 Drawing Sheets

(51) Int. Cl.
*G09G 3/32* (2016.01)
*H01L 25/075* (2006.01)

(56) References Cited

U.S. PATENT DOCUMENTS

| | | | |
|---|---|---|---|
| 10,910,352 B2* | 2/2021 | Edmond | H01L 25/0753 |
| 11,227,891 B2* | 1/2022 | Chen | G02B 6/0073 |
| 11,600,656 B2* | 3/2023 | Armitage | H01L 27/156 |
| 2004/0256977 A1* | 12/2004 | Aston | H10K 59/18 |
| | | | 313/498 |
| 2012/0236509 A1* | 9/2012 | Cope | F21V 21/096 |
| | | | 361/730 |
| 2015/0247627 A1* | 9/2015 | Cope | G09F 9/3026 |
| | | | 362/249.08 |
| 2016/0371047 A1* | 12/2016 | Cope | G09F 9/30 |
| 2017/0359916 A1* | 12/2017 | Hochman | G09F 19/22 |
| 2020/0066828 A1 | 2/2020 | Meersman et al. | |
| 2020/0075663 A1* | 3/2020 | Matsushita | H01L 33/62 |
| 2020/0113078 A1* | 4/2020 | Kim | H05K 5/03 |
| 2020/0159054 A1* | 5/2020 | Jeong | G02F 1/13336 |
| 2020/0163233 A1* | 5/2020 | Brackley | H01L 25/0753 |
| 2020/0193943 A1* | 6/2020 | Iversen | G06F 3/1446 |
| 2021/0231993 A1* | 7/2021 | Jeong | G02F 1/13336 |
| 2021/0286579 A1* | 9/2021 | Cope | H01L 31/206 |
| 2022/0093724 A1* | 3/2022 | Bower | H10K 59/18 |
| 2022/0208949 A1* | 6/2022 | Kang | H01L 23/544 |

FOREIGN PATENT DOCUMENTS

| | | |
|---|---|---|
| CN | 210244920 U | 4/2020 |
| CN | 111276474 A | 6/2020 |
| CN | 211857997 U | 11/2020 |
| CN | 212380069 U | 1/2021 |
| CN | 212460264 U | 2/2021 |
| CN | 113327515 A | 8/2021 |
| CN | 214474331 U | 10/2021 |
| CN | 215264316 U | 12/2021 |
| CN | 215729186 U | 2/2022 |

* cited by examiner

DISPLAY PANEL AND LIGHT BOARD

CROSS REFERENCE TO RELATED APPLICATIONS

This application is a National Phase of PCT Patent Application No. PCT/CN2022/080853 having International filing date of Mar. 15, 2022, which claims the benefit of priority of Chinese Patent Application No. 202210197653.8, filed Mar. 2, 2022, the contents of which are all incorporated herein by reference in their entirety.

FIELD

The present disclosure relates to the field of display technologies, and more particularly, to a display panel and a light board.

BACKGROUND

Mini-light-emitting diodes (mini-LED) are usually used as a backlight source in the liquid crystal display (LCD) industry. Mini-LED backlighting can achieve brightness and darkness in different areas, and functions such as high dynamic contrast, high dynamic range imaging (HDR), etc. Due to limitations of processes and technologies of light board manufacturers, a size of a light board cannot be increased indefinitely, and a backlight is usually formed by splicing a plurality of light boards.

However, when an LED display screen or LED box body formed through splicing displays video images, splicing lines are very obvious, which easily affect a display effect.

SUMMARY

The present application provides a display panel and a light board that can solve a problem of splicing seams in display panels being too obvious.

The present application provides a display panel, and the display panel includes:
 a back board; and
 a plurality of light boards. The plurality of light boards are disposed on the back board, each of the plurality of light boards includes a plurality of light beads arranged in an array, and a first substrate and a second substrate disposed in a stack. The plurality of light beads are disposed on a side of the first substrate, and the second substrate are disposed on a side of the first substrate away from the plurality of light beads. The first substrate includes a first portion exceeding the second substrate, and the second substrate includes a second portion exceeding the first substrate.

The first portion in one of the plurality of light boards and the second portion in another adjacent one of the plurality of light boards are stacked to splice two of the plurality of light boards, and a distance between two adjacent and outermost columns of the plurality of light beads of the two of the plurality of light boards is within a preset range.

The present application further provides a display panel, and the display panel includes:
 a back board; and
 a plurality of light boards. The plurality of light boards are arranged on the back board, and the plurality of light boards includes a plurality of light beads arranged in an array, a first substrate, and a second substrate. The second substrate is arranged on a side of the first substrate and overlapping the first substrate. The first substrate includes an overlapping region overlapping with the first substrate second substrate and an edge region protruding from the second substrate. Edge regions of two adjacent plurality of light boards all form splicing regions with to form the plurality of light boards, and a distance between two adjacent columns of light beads on two sides of each of the splicing regions is within a preset range.

Beneficial effects of the present application are as follows: An embodiment of the present application provides a display panel. The display panel includes the back board and the plurality of light boards. The plurality of light boards are arranged on the back board, and each light board includes the plurality of light beads arranged in an array, and the first substrate and the second substrate that are partially stacked. The plurality of light beads are arranged on a side of the first substrate, and the second substrate is arranged on the side of the first substrate away from the plurality of light beads. The first substrate includes the first portion exceeding the second substrate, and the second substrate includes the second portion exceeding the first substrate. Through splicing the first portion in one of the plurality of light boards and the second portion in another adjacent one of the light board, the distance between the two adjacent and outermost columns of light beads of two adjacent light boards is within a preset range, so that splicing seams can be blocked by the plurality of light beads, and the plurality of light boards that are spliced can emit light evenly, thereby preventing an existence of shadow of the splicing seams, maintaining a light-emitting region to be unaffected, so as to reduce an effect of the splicing seams and increase a display effect.

DETAILED DESCRIPTION

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the present application.

In the description of the present application, it should be explained that the terms "center", "portrait", "transverse", "length", "width", "thickness", "upper", "lower", "front", "back", "left", "right", "vertical", "horizontal", "top", "bottom", "inside", "outside", etc. are based on the drawings. The orientation or positional relationship is only for the convenience of describing the present application and simplifying the description, and does not indicate or imply that the device or element referred to must have a specific orientation, structure and operation in a specific orientation, and should not be viewed as limitations of the present application. In addition, terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "multiple" is two or more, unless specifically defined otherwise.

In the prior art, a light-emitting diode (LED) display screen and a LED box body are formed by a plurality of LED unit boards that are spliced together. Generally, the LED unit boards in rectangular shapes are adopted, and for the sake of convenience of mounting, a certain splicing space is usually reserved on edges of mounting portions of display surfaces of the LED unit boards. Therefore, when the LED display screen or the LED box body formed through splicing displays video images, splicing lines are very obvious, which easily affect a display effect.

Therefore, in order to solve above-mentioned problems, the present application proposes a display panel and a light board. The following describes the present application in detail with reference to the accompanying drawings and implementations.

Figure 1:
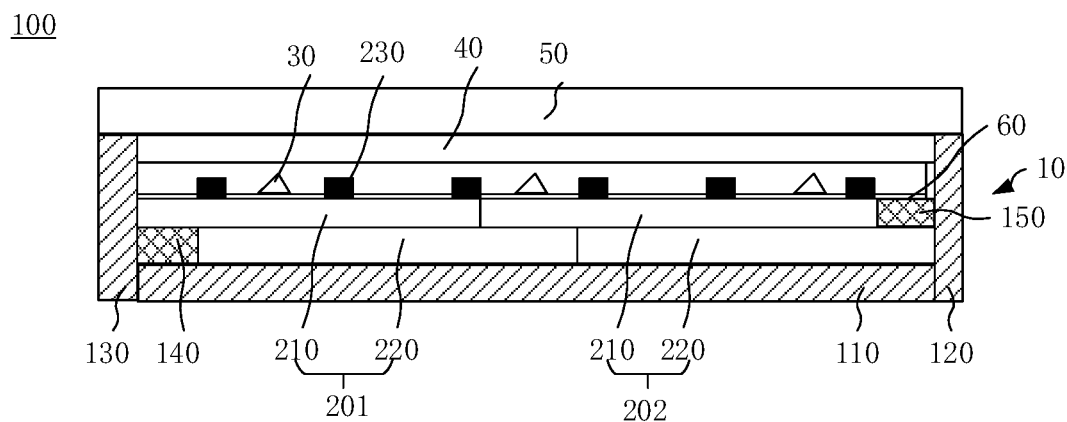
FIG. 1 is a first structural schematic view of a display panel provided by an embodiment of the present application.
Figure 2:
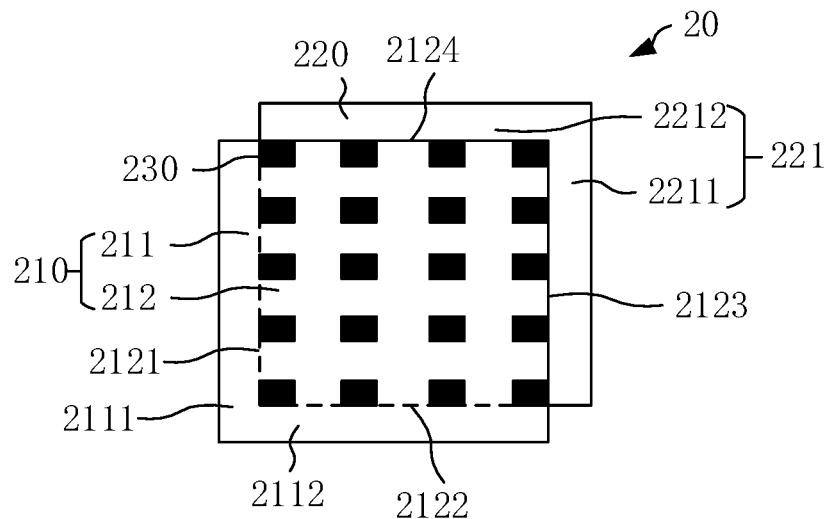
FIG. 2 is a structural schematic view of a light board in the display panel provided in FIG. 1.

Referring to FIGS. 1-2, FIG. 1 is a first structural schematic view of a display panel provided by an embodiment of the present application, and FIG. 2 is a structural schematic view of a light board in the display panel provided in FIG. 1. An embodiment of the present application provides a display panel 100. The display panel 100 includes a back board 10 and a plurality of light boards 20. Each light board 20 is disposed on the back board 10, and each light board 20 includes a plurality of light beads 230 arranged in an array, and a first substrate 210 and a second substrate 220 disposed in a stack. The plurality of light beads 230 are disposed on a side of the first substrate 210, and the second substrate 220 is disposed on a side of the first substrate 210 away from the plurality of light beads 230. The first substrate 210 includes a first portion 211 that exceeds the second substrate 220, the second substrate 220 includes a second portion 221 that exceeds the first substrate 210, and a first portion 211 in one of the plurality of light boards 20 splices with a second portion 221 in another adjacent one of the plurality of light boards 20. The distance between two adjacent and outermost columns of light beads 230 in the two light boards 20 is within a preset range, and the two columns of light beads 230 are flush with each other in a splicing direction. Through overlapping the two adjacent light boards 20 through the first portion 211 and the second portion 221, the plurality of light boards 20 can be spliced together, and a distance between two adjacent columns of light beads 230 on two sides after splicing is within the preset range, splicing seams between adjacent light boards 20 that are spliced can be blocked by the plurality of light beads 230, so that the splicing seams do not appear after splicing of the plurality of light boards 20, which can reduce an effect of the splicing seams on the display panel 100, prevent an existence of shadow of the splicing seams, and increase a display effect.

It should be noted that a thickness of the first substrate 210 and a thickness of the second substrate 220 are the same, so that a plurality of groups of light boards 20 can be on a same horizontal direction after splicing, thereby preventing a problem of discontinuous layers of the plurality of light boards 20 after splicing.

The back board 10 includes a bottom wall 110 and a side wall arranged around the bottom wall 110. The side wall includes a first side wall 130 and a second side wall 120 that are oppositely arranged. A first protrusion 140 is disposed on an end of the bottom wall 110 adjacent to the first side wall 130, a second protrusion 150 is disposed on the second side wall 120, and the second protrusion 150 is spaced from the bottom wall 110 to form a slot.

A light-emitting region 212 in the light board 20 includes a first column of light beads 2121, a first row of light beads 2122, a second column of light beads 2123, and a second row of light beads 2124 arranged in sequence. The first substrate 210 includes a fifth side, a sixth side, a seventh side, and an eighth side arranged in sequence. The first column of light beads 2121 is disposed corresponding to the fifth side, and a first edge region 2111 is formed between the first column of light beads 2121 and the fifth side. The first row of light beads 2122 is disposed corresponding to the sixth side, and a second edge region 2112 is formed between the first row of light beads 2122 and the sixth side. That is to say, the first portion 211 includes the first edge region 2111 adjacent to the first column of light beads 2121 and the second edge region 2112 adjacent to the first row of light beads 2122. The second portion 221 includes a third edge region 2211 adjacent to the second column of light beads 2123 and a fourth edge region 2212 adjacent to the second row of light beads 2124.

In a first direction or in a second direction of any light board 20, a first distance between the first column of light beads 2121 and the fifth side is less than or equal to a distance between two adjacent light beads 230. That is to say, the first distance between an outer edge in the first edge region 2111 corresponding to the first column of light beads 2121 and the first column of light beads 2121 is less than or equal to the distance between two adjacent light beads 230.

A second distance between the first row of light beads 2122 and the sixth side is less than or equal to the distance between two adjacent light beads 230. That is to say, the second distance between an outer edge in the second edge region 2112 corresponding to the first row of light beads 2122 and the first row of light beads 2122 is less than or equal to the distance between two adjacent light beads 230.

A third distance between an outer edge in the third edge region 2211 corresponding to the second column of light beads 2123 and the second column of light beads 2123 is less than or equal to the distance between two adjacent light beads 230.

A fourth distance between an outer edge in the fourth edge region 2212 corresponding to the second row of light beads 2124 and the second row of light beads 2124 is less than or equal to the distance between two adjacent light beads 230.

It should be noted that, through having the first distance, the second distance, the third distance, and the fourth distance disposed to be less than or equal to the distance between two adjacent light beads 230, after the adjacent light boards 20 are spliced in splicing regions, the distance between the two adjacent rows of light beads 230 on two sides is similar to a distance between the two adjacent rows of light beads 230 on a single light board 20, which can prevent a distance between the splicing seams and the plurality of light beads 230 from being too large, so that the plurality of light boards 20 that are spliced do not visually show the splicing seams.

In some other embodiments, the second column of light beads 2123 are arranged to overlap with the seventh side, and the second rows of light beads 2124 are arranged to overlap with the eighth side. That is to say, a distance between light beads 230 on the second column of light beads 2123 and an outer edge of the first substrate 210 corresponding to the second column of light beads 2123 is zero, and a distance between light beads 230 on the second row of light beads 2124 and an outer edge of the first substrate 210 corresponding to the second row of light beads 2124 is zero. Through arranging the second column of light beads 2123 to overlap with the seventh side, and the second row of light beads 2124 to overlap with the eighth side, the splicing seams can be blocked by the plurality of light beads 230, thereby solving a problem of the shadow of the splicing seams. It can be understood that the second column of light beads 2123 and the seventh side are not necessarily fully overlapped, and a distance between the second column of light beads 2123 and the seventh side can also be within a certain preset range, and the second row of light beads 2124 and the eighth side are not necessarily fully overlapped, and a distance between the second row of light beads 2124 and the eighth side can also be within a certain preset range. Specific settings can be arranged according to actual situations, which are not specifically limited herein.

In some embodiments, the first distance and the third distance both equal to the distance between two adjacent light beads 230, and the second distance and the fourth distance are zero. Through such arrangement, the plurality of light boards 20 can be spliced along the first direction perpendicular to the first column of light beads 2121.

In some embodiments, the first distance and the third distance are zero, and the second distance and the fourth distance both equal to the distance between two adjacent light beads 230. Through such arrangement, the plurality of light boards 20 can be spliced along the second direction perpendicular to the first row of light beads 2122.

In some other embodiments, the first distance, the second distance, the third distance, and the fourth distance all equal to the distance between two adjacent light beads 230. Through such arrangement, the plurality of light boards 20 can be spliced along the first direction perpendicular to the first column of light beads 2121 and the second direction perpendicular to the first row of light beads 2122, so that each splicing seams are all arranged at edges of the plurality of light beads 230, and the plurality of light beads 230 can block the splicing seams to solve the problem of the shadow of the splicing seams.

Figure 3:
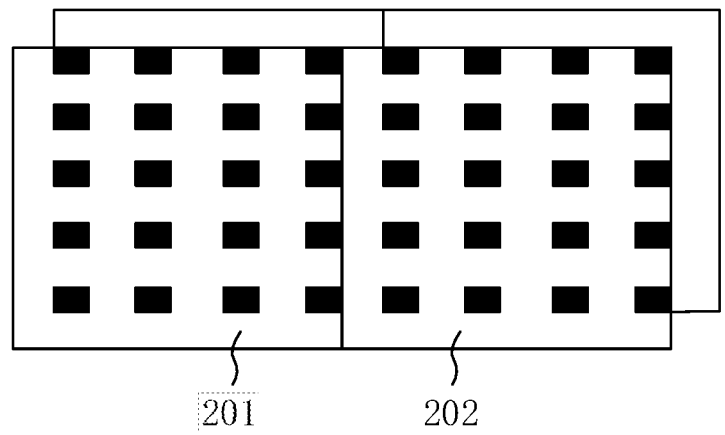
FIG. 3 is a structural schematic view of a first type of splicing of a plurality of light boards in the display panel provided in FIG. 1.
Figure 4:
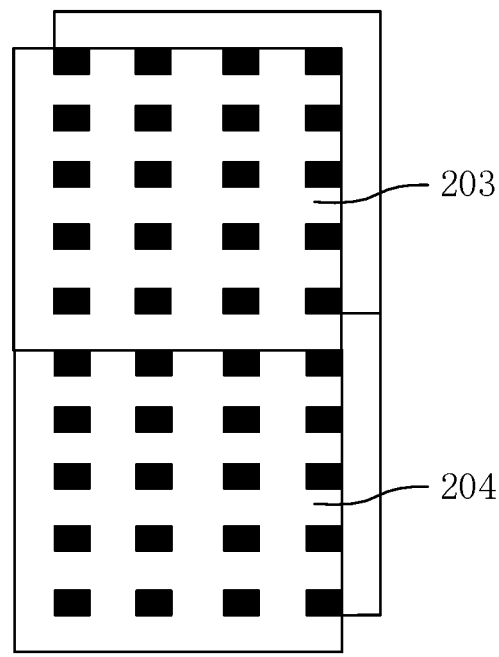
FIG. 4 is a structural schematic view of a second type of splicing of the plurality of light boards in the display panel provided in FIG. 1.
Figure 5:
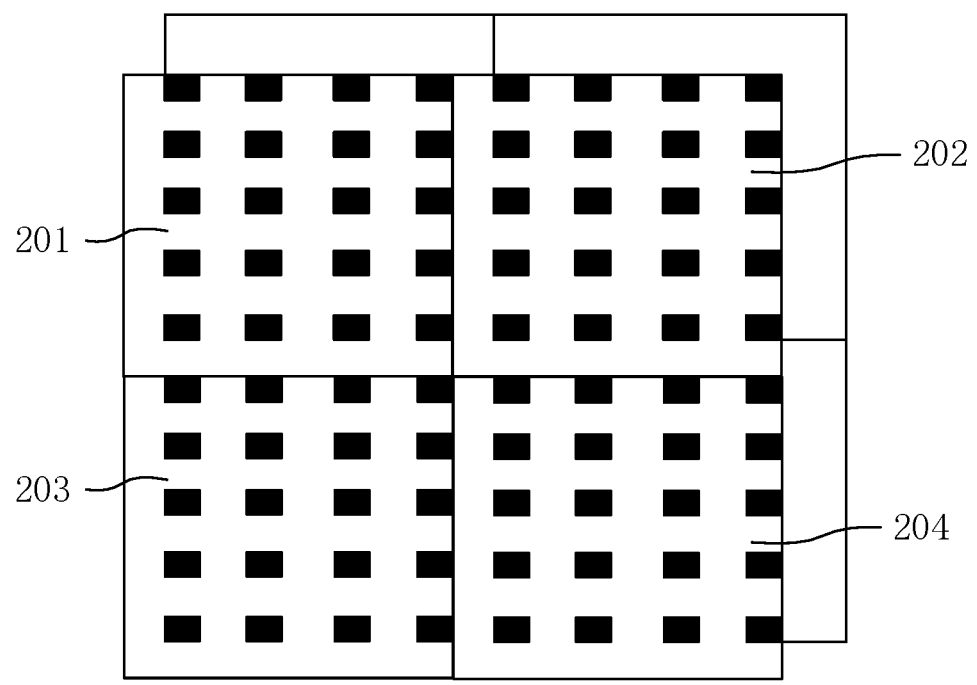
FIG. 5 is a structural schematic view of a third type of splicing of the plurality of light boards in the display panel provided in FIG. 1.

For example, references are further made to FIG. 3 to FIG. 5. FIG. 3 is a structural schematic view of a first type of splicing of the plurality of light boards in the display panel provided in FIG. 1. FIG. 4 is a structural schematic view of a second type of splicing of the plurality of light boards in the display panel provided in FIG. 1. FIG. 5 is a structural schematic view of a third type of splicing of the plurality of light boards in the display panel provided in FIG. 1. As shown in FIG. 3, the plurality of light boards 20 include a first light board 201 and a second light board 202 arranged in the first direction. The first edge region 2111 of the second light board 202 splices on the third edge region 2211 of the first light board 201. A distance between the second column of light beads 2123 in the first light board 201 and the first column of light beads 2121 in the second light board 202 is within a preset range. The second row of light beads 2124 in the first light board 201 are flush with the second row of light beads 2124 in the second light board 202 in the first direction. That is to say, a distance between the plurality of light beads 230 in the first light board 201 adjacent to the third edge region 2211 and the plurality of light beads 230 in the second light board 202 adjacent to the first edge region 2111 is within a preset range, and the plurality of light beads 230 in the first light board 201 adjacent to the fourth edge region 2212 are flush with the plurality of light beads 230 in the second light board 202 adjacent to the fourth edge region 2212 in the first direction.

When the light board 20 is mounted on the back board 10, the first edge region 2111 is disposed on a side of the first protrusion 140 away from the bottom wall 110, the third edge region 2211 is adapted to the slot, a side in the second substrate 220 overlapping with the first column of light beads 2121 is abuts against a side of the first protrusion 140 away from the first side wall 130, and the second column of light beads 2123 abuts against a side of the second protrusion 150 away from the second side wall 120, so that the light board 20 is engaged with the back board 10. Through the first edge region 2111, the second edge region 2112, the third edge region 2211, and the fourth edge region 2212 that are protrudingly arranged, and a conjunction of the slot in the back board 10 and the first protrusion 140, the light board 20 can be engaged with the back board 10 to prevent the light board 20 from shaking after being mounted on the back board 10.

As shown in FIG. 4, the plurality of light boards 20 include a third light board 203 and a fourth light board 204 arranged in a second direction, and the first direction is perpendicular to the second direction. The second edge region 2112 in the third light board 203 splices on the fourth edge region 2212 in the fourth light board 204, a distance between the first row of light beads 2122 in the third light board 203 and the second row of light beads 2124 in the fourth light board 204 is within a preset range, and the first column of light beads 2121 in the third light board 203 are flush with the first column of light beads 2121 in the second light board 202 in the second direction. That is to say, a distance between the plurality of light beads 230 in the first light board 201 adjacent to the second edge region 2112 and the plurality of light beads 230 in the second light board 202 adjacent to the fourth edge region 2212 is within a preset range, and the plurality of light beads 230 in the first light board 201 adjacent to the first edge region 2111 are flush with the plurality of light beads 230 in the second light board 202 adjacent to the second edge region 2112 in the second direction.

When the light board 20 is mounted on the back board 10, the first edge region 2111 of the first light board 201 and the first edge region 2111 of the second light board 202 are both disposed on the side of the first protrusion 140 away from the bottom wall 110, the third edge region 2211 of the second light board 202 and the third edge region 2211 of the first light board 201 are at least partially disposed in the slot. In some other embodiments, a side of a third portion of the first light board 201 overlapping with the first column of light beads 2121 abuts the side of the first protrusion 140 away from the first side wall 130, and the second column of light beads 2123 of the second light board 202 abuts the side of the second protrusion 150 away from the second side wall 120.

As shown in FIG. 5, the plurality of light boards 20 include the first light board 201, the second light board 202, the third light board 203, and the fourth light board 204. The first light board 201 and the second light board 202 are arranged in the first direction, the third light board 203 and the fourth light board 204 are arranged in the first direction. The first light board 201 and the third light board 203 are arranged in the second direction, and the second light board 202 and the fourth light board 204 are arranged in the second direction. The first edge region 2111 in the second light board 202 splices with the third edge region 2211 in the first light board 201, and the first edge region 2111 in the fourth light board 204 splices with the third edge region 2211 in the third light board 203, the second edge region 2112 in the third light board 203 splices with the fourth edge region 2212 in the first light board 201, and the second edge region 2112 in the fourth light board 204 splices with the fourth edge region 2212 in the second light board 202.

It can be understood that the display panel 100 can be any number of the plurality of light boards 20 that are spliced, and a number and a direction of splicing can be arranged according to requirements, which are not limited to above-mentioned examples, and are not specifically limited herein.

As shown in FIG. 2, an embodiment of the present application further provides a light board 20, the light board 20 includes a plurality of light beads 230 arranged in an array, and a first substrate 210 and a second substrate 220 disposed in a stack. The plurality of light beads 230 are disposed on a side of the first substrate 210, and the second substrate 220 is disposed on a side of the first substrate 210 away from the plurality of light beads 230. The first substrate 210 includes a first portion 211 that exceeds the second substrate 220, and the second substrate 220 includes a second portion 221 that exceeds the first substrate 210.

A light-emitting region 212 in the light board 20 includes a first column of light beads 2121, a first row of light beads 2122, a second column of light beads 2123, and a second row of light beads 2124. A distance between the first column of light beads 2121 and an outer edge in the first substrate 210 corresponding to the first column of light beads 2121 is within a preset range, a distance between the first row of light beads 2122 to an outer edge in the first substrate 210 corresponding to the first row of light beads 2122 is within a preset range, a distance between the second column of light beads 2123 and an outer edge in the first substrate 210 corresponding to the second column of light beads 2123 is zero, and a distance between the plurality of light beads 230 on the second row of light beads 2124 and an outer edge in the first substrate 210 corresponding to the second row of light beads 2124 is zero.

It can be understood that details of the light board 20 can be found in the above description, which will not be reiterated herein.

Figure 6:
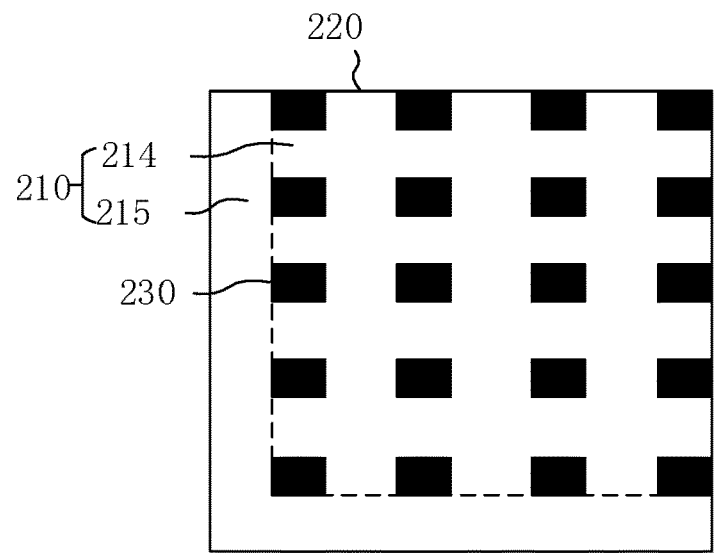
FIG. 6 is a second structural schematic view of a display panel provided by an embodiment of the present application.
Figure 7:
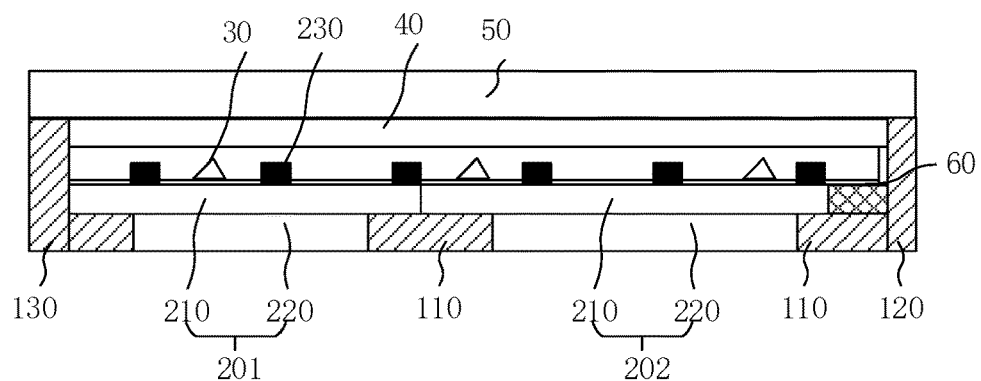
FIG. 7 is a structural schematic view of a light board in the display panel provided in FIG. 6.
Figure 8:
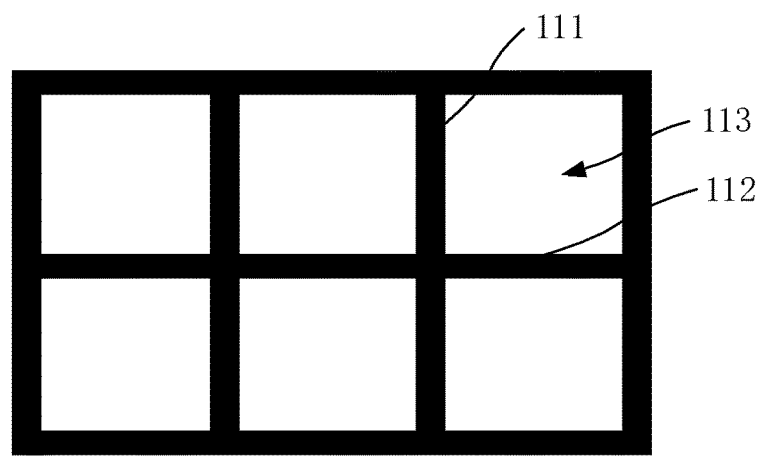
FIG. 8 is a top view of a back board in the display panel provided in FIG. 6.

References are further made to FIG. 6 to FIG. 8. FIG. 6 is a second structural schematic view of a display panel provided by an embodiment of the present application. FIG. 7 is a structural schematic view of a light board in the display panel provided in FIG. 6. FIG. 8 is a top view of a back board in the display panel provided in FIG. 6.

Embodiments of the present application further provide a display panel 100. The display panel 100 includes a back board 10 and a plurality of light boards 20. The light boards 20 are disposed on the back board 10, and the light boards 20 include a plurality of light beads 230 arranged in an array, a first substrate 210, and a second substrate 220. The second substrate 220 is arranged on a side of the first substrate 210 and overlaps the first substrate 210. That is to say, a projection of the second substrate 220 on the first substrate 210 is within the first substrate 210. The first substrate 210 includes an overlapping region 214 that overlaps the first substrate 210 second substrate 220 and an edge region 215 that protrudes from the second substrate 220, and the edge regions 215 of two adjacent light boards 20 are overlapped with the light boards 20 to form a tiling region. A distance between two adjacent columns of light beads 230 on two sides of the tiling region is within a preset range, and the two adjacent columns of light beads 230 on the two sides of the tiling region are flush with each other in a tiling direction. By connecting protruding portions of the first substrate 210 relative to the second substrate 220 in the light boards 20 to the back board 10, the tiling seams of the light boards 20 can be arranged on the back board 10, i.e., a non-display region. In this way, the tiling seams can be blocked, thereby reducing an effect of the tiling seams on the display panel 100.

The back board 10 includes a plurality of first reinforcing ribs 111 arranged at intervals in a vertical direction and a plurality of second reinforcing ribs 112 arranged at intervals in a horizontal direction. On a back side of the back board 10, a hollow structure 113 is formed between the first reinforcing ribs 111 and the second reinforcing ribs 112 that are intersecting, and the edge regions 215 in the plurality of light boards 20 are connected with the first reinforcing ribs 111 or the second reinforcing ribs 112. The second substrate 220 in each light board 20 is disposed in the hollow structure 113, so that a distance between two adjacent columns of light beads 230 that are spliced at the first reinforcing rib 111 or the second reinforcing rib 112 is within a preset range, and the two adjacent columns of light beads 230 on the two sides of the splicing region are flush with each other in the splicing direction. Through a design of the back board 10, the plurality of light boards 20 can be positioned and fixed, which reduces a difficulty of splicing the plurality of light boards 20, and achieves thinning of the display panel 100.

It can be understood that a width of the edge region 215 of the first substrate 210 in each light board 20 is smaller than a width of the first reinforcing ribs 111 and the second reinforcing ribs 112, such that when two adjacent light boards 20 are spliced together, the splicing seams are just right on the first reinforcing ribs 111 or the second reinforcing ribs 112, thereby solving the effect of the splicing seams.

It should be noted that, in some embodiments, graphene is attached to back sides of the plurality of light boards 20 for heat dissipation, so as to solve a problem of heat dissipation and increase a service life of the plurality of light boards 20.

The display panel 100 further includes a reflection sheet 60, support posts 30, a fully-fitted diffuser board 40 and an over coat (OC) layer 50. The reflection sheet 60 is disposed on the light board 20, and the support posts 30 are disposed at intervals among the light beads 230. The fully-fitted diffuser board 40 is disposed on a side of the light board 20 away from the back board 10, and the OC layer 50 is disposed on a side of the fully-fitted diffuser plate 40 away from the back board 10.

The display panel and the light board provided by the present application are described in detail above, the specific examples of this document are used to explain principles and embodiments of the present application, and the description of embodiments above is only for helping to understand the present application. Meanwhile, those skilled in the art will be able to change the specific embodiments and the scope of the present application according to the idea of the present application. In the above, the content of the specification should not be construed as limiting the present application. Above all, the content of the specification should not be the limitation of the present application.

What is claimed is:

1. A display panel, wherein the display panel comprises:
a back board; and
a plurality of light boards, the plurality of light boards being disposed on the back board, each of the plurality of light boards comprising a plurality of light beads arranged in an array, and a first substrate and a second substrate disposed in a stack; the plurality of light beads being disposed on a side of the first substrate, the second substrate being disposed on a side of the first substrate away from the plurality of light beads; the first substrate comprising a first portion exceeding the second substrate, and the second substrate comprising a second portion exceeding the first substrate;
wherein the first portion in one of the plurality of light boards and the second portion in another adjacent one of the plurality of light boards are stacked to splice two of the plurality of light boards, and a distance between two adjacent and outermost columns of the plurality of light beads of the two of the plurality of light boards is within a preset range,
wherein the plurality of light beads on one of the plurality of light boards comprise a first column of light beads, a first row of light beads, a second column of light beads, and a second row of light beads located on outermost sides; the first column of light beads and the second column of light beads are arranged in parallel, and the first row of light beads and the second row of light beads are arranged in parallel; the first portion comprises a first edge region adjacent to the first column of light beads and a second edge region adjacent to the first row of light beads, the second portion comprises a third edge region adjacent to the second column of light beads and a fourth edge region adjacent to the second row of light beads;
the plurality of light boards comprise a first light board and a second light board arranged along a first direction, and a first edge region in the second light board is spliced on a third edge region in the first light board, a distance between a second column of light beads in the first light board and the first column of light beads in the second light board is within a preset range, and a second row of light beads in the first light board are flush with a second row of light beads in the second light board in the first direction.

2. The display panel according to claim 1, wherein the plurality of light boards comprise a third light board and a fourth light board arranged in a second direction, the first direction is perpendicular to the second direction, a second edge region of the third light board is spliced on a fourth edge region of the fourth light board, a distance between a first row of light beads in the third light board and a second row of light beads in the fourth light board is within a preset range, and a first column of light beads in the third light board is flush with a first column of light beads in the fourth light board in the second direction.

3. The display panel according to claim 1, wherein the back board comprises a bottom wall and a side wall arranged around the bottom wall, the side wall comprises a first side wall and a second side wall oppositely arranged, a first protrusion is disposed on the bottom wall, the first protrusion is disposed adjacent to the first side wall, a second protrusion is disposed on the second side wall, and the second protrusion is spaced from the bottom wall to form a slot;
the first edge region of the first light board is disposed on a side of the first protrusion away from the bottom wall, and the third edge region of the second light board is at least partially disposed in the slot.

4. The display panel according to claim 3, wherein the second protrusion comprises a first end away from the second side wall,
a side of the first edge region of the first light board away from the first row of light beads abuts against the first side wall;
the second column of light beads of the second light board abuts against the first end.

5. The display panel according to claim 2, wherein, for any one of the plurality of light boards on the first direction and the second direction,
a first distance between an outer edge in the first edge region corresponding to the first column of light beads and the first column of light beads is less than or equal to a distance between any two adjacent light beads;
a second distance between an outer edge in the second edge region corresponding to the first row of light beads and the first row of light beads is less than or equal to the distance between any two adjacent light beads;
a third distance between an outer edge in the third edge region corresponding to the second column of light beads is and the second column of light beads less than or equal to the distance between any two adjacent light beads;
a fourth distance between an outer edge in the fourth edge region corresponding to the second row of light beads and the second row of light beads is less than or equal to the distance between any two adjacent light beads.

6. The display panel according to claim 4, wherein the second column of light beads is arranged on an outer edge of the first substrate away from the first edge region, and the second row of light beads is arranged on an outer edge of the first substrate away from the second edge region;
the first distance and the third distance are both equal to the distance between any two adjacent light beads, and the second distance and the fourth distance are zero; or
the first distance and the third distance are zero, and the second distance and the fourth distance are both equal to the distance between any two adjacent light beads.

7. The display panel according to claim 4, wherein the second column of light beads is arranged on an outer edge of the first substrate away from the first edge region, and the second row of light beads is arranged on an outer edge of the first substrate away from the second edge region;
the first distance, the second distance, the third distance, and the fourth distance are all equal to the distance between any two adjacent light beads.

8. The display panel according to claim 1, wherein a thickness of the first substrate equals to a thickness of the second substrate.

9. A light board, wherein the light board comprises:
a plurality of light beads arranged in an array; and
a first substrate and a second substrate, the plurality of light beads being disposed on a side of the first substrate, the second substrate being disposed on a side of the first substrate opposite to the plurality of light beads, the first substrate comprising a first portion exceeding the second substrate, and the second substrate comprising a second portion exceeding the first substrate;
wherein the plurality of light beads comprise a first column of light beads, a first row of light beads, a second column of light beads, and a second row of light beads that are sequentially disposed, a distance between the first column of light beads and an outer edge in the first substrate corresponding to the first column of light beads is within a preset range, a distance between the first row of light beads and an outer edge in the first substrate corresponding to the first row of light beads is within a preset range, a distance between the second column of light beads and an outer edge in the first substrate corresponding to the second column of light beads is zero, and a distance between the second row of light beads and an outer edge in the first substrate corresponding to the second row of light beads is zero.

10. The light board according to claim 9, wherein a thickness of the first substrate equals to a thickness of the second substrate.

11. The light board according to claim 9, wherein the distance between the first column of light beads and the outer edge in the first substrate corresponding to the first column of light beads is less than or equal to a distance between any two adjacent light beads.

12. The light board according to claim 9, wherein the distance between the first row of light beads and the outer edge in the first substrate corresponding to the first row of light beads is less than or equal to the distance between any two adjacent light beads.

13. The light board according to claim 9, wherein the distance between the first column of light beads and the outer edge in the first substrate corresponding to the first column of light beads equals to the distance between the first row of light beads and the outer edge in the first substrate corresponding to the first row of light beads.

14. The light board according to claim 9, wherein the second portion comprises a third edge region adjacent to the second column of light beads and a fourth edge region adjacent to the second row of light beads, a third distance between an outer edge in the third edge region corresponding to the second column of light beads and the second column of light beads is less than or equal to the distance between any two adjacent light beads.

15. The light board according to claim 14, wherein a fourth distance between an outer edge in the fourth edge region corresponding to the second row of light beads and the second row of light beads is less than or equal to the distance between any two adjacent light beads.

16. The light board according to claim 15, wherein the third distance and the fourth distance are equal.

17. A display panel, wherein the display panel comprises:
a back board;
a plurality of light boards, the plurality of light boards being disposed on the back board, the light board comprising a plurality of light beads arranged in an array, and a first substrate and a second substrate disposed in a stack; the second substrate is stacked with the first substrate on a side of the first substrate, the first substrate comprises a stacking region stacked with the second substrate and a periphery region exceeding the second substrate, periphery regions of two adjacent plurality of light boards are stacked with the plurality of light boards to form a splicing region, and a distance between two columns of the plurality of light beads on two sides of the splicing region is within a preset range,
wherein the back board comprises a plurality of first reinforcing ribs arranged at intervals in a vertical direction and a plurality of second reinforcing ribs arranged at intervals in a horizontal direction, and the first reinforcing ribs and the second reinforcing ribs are arranged perpendicular to one another on a back side of the back board; a hollow structure is formed between the first reinforcing ribs and the second reinforcing ribs that are intersecting, and edge regions in the plurality of light boards are connected to the first reinforcing ribs or the second reinforcing ribs; the second substrate in each of the plurality of light boards is arranged in the hollow structure, so that a distance between two adjacent columns of the plurality of light beads spliced at the first reinforcing ribs or the second reinforcing ribs is within a preset range, and the two adjacent columns of the plurality of light beads on two sides of the splicing region are flush with each other in a splicing direction.

18. The display panel according to claim 17, wherein the display panel comprises a reflective sheet, supporting posts, a fully-fitted diffuser board, and an over coat (OC) layer, wherein the reflective sheet is disposed on the light board, the supporting posts are disposed at intervals among the plurality of light beads, the fully-fitted diffuser board is disposed on a side of the light board away from the back board, and the OC layer is disposed on a side of the fully-fitted diffuser board away from the back board.

* * * * *